United States Patent [19]
Nakajima

[11] Patent Number: 5,897,978
[45] Date of Patent: Apr. 27, 1999

[54] MASK DATA GENERATING METHOD AND MASK FOR AN ELECTRON BEAM EXPOSURE SYSTEM

[75] Inventor: Ken Nakajima, Tokyo, Japan

[73] Assignee: NEC Corporation, Tokyo, Japan

[21] Appl. No.: 08/883,752

[22] Filed: Jun. 27, 1997

[30] Foreign Application Priority Data

Jun. 27, 1997 [JP] Japan ................................. 8-167675

[51] Int. Cl.⁶ .................................................. G03F 9/00
[52] U.S. Cl. .............................................. 430/5; 430/296
[58] Field of Search ................................ 430/5, 296, 322

[56] References Cited

U.S. PATENT DOCUMENTS

| | | | |
|---|---|---|---|
| 5,334,282 | 8/1994 | Nakayama et al. | 430/5 |
| 5,624,774 | 4/1997 | Okino et al. | 430/5 |
| 5,650,250 | 7/1997 | Moon | 430/5 |
| 5,705,299 | 1/1998 | Tew et al. | 430/5 |

FOREIGN PATENT DOCUMENTS 5-136036  6/1993  Japan .
5-343304  12/1993  Japan .

OTHER PUBLICATIONS

"High Throughput Electron Beam Lithography System", Hitachi Review, vol. 76, No. 7 (1994–11).

*Primary Examiner*—S. Rosasco

[57] ABSTRACT

In accordance with the present invention, repeated patterns are produced beforehand without dividing patterns included in design pattern data. The repeated pattern data are used to produce a mask for partial full electron beam exposure. This insures a resist pattern free from connection errors on the boundaries between the repeated pattern areas. The invention therefore obviates connection errors of about 0.02 μm to 0.03 μm heretofore occurring at each time of a partial simultaneous electron beam shot, and thereby enhances the dimensional accuracy of a resist pattern produced by electron beam exposure.

4 Claims, 6 Drawing Sheets

MASK DATA GENERATING METHOD AND MASK FOR AN ELECTRON BEAM EXPOSURE SYSTEM

BACKGROUND OF THE INVENTION

The present invention relates to a mask data generating method and a mask for an electron beam exposure system, particularly an electron beam exposure system of the type exposing a plurality of desired patterns collectively in a large scale memory or similar semiconductor integrated circuit (IC).

Today, even patterns as fine as 0.2 $\mu$m to 0.3 $\mu$m or so are applied to semiconductor IC quantity production lines. In parallel with the decreasing pattern size, not only photolithography using ultraviolet rays and X-ray lithography using X-rays but also electron beam lithography using an electron beam are attracting increasing attention. However, a known electron beam exposure system has a problem that the throughput is far lower than the throughput available with an optical aligner using a stepper, as taught in "High Throughput Electron Beam Lithography System", Hitachi Review, Vol. 76, No. 7 (1994–7). A simultaneous electron beam exposing method is capable of improving the minimum fabricating dimensions and enhancing the throughput. This kind of exposing method uses a mask for an electron beam exposure system is formed with a desired pattern beforehand. The mask promotes efficient exposure especially when a number of identical patterns are sequentially exposed like the memory cells of a large scale memory.

It is a common practice with the simultaneous electron beam exposing method to produce a mask formed with a desired pattern in the from of an aperture. The mask is located in the vicinity of the optical axis of an electron beam. An electron beam is radiated via the aperture in order to transfer the desired pattern to a silicon (Si) wafer. To increase the throughput of an exposure system, it has been customary to determine the size of the aperture on the basis of, among various repeated pattern areas included in design data, the size of a repeated pattern area closest to the maximum shot or radiation area.

Japanese Patent Laid-Open Publication No. 5-343304, for example, discloses a method of extracting out of design data a repeated pattern having the maximum size applicable to a partial simultaneous electron beam exposure system. This method implements efficient extraction by executing the extraction with consecutive mask patterns in parallel. However, the problem is that a repeated pattern closest in size to the largest area which a partial simultaneous electron beam exposure system can shoot is simply extracted. Specifically, assume that this method is applied to, e.g., a device separation pattern or a capacity pattern of a DRAM (Dynamic Random Access Memory). Then, even when the desired pattern is smaller in size than the maximum shot, patterns extending over the boundary between nearby shots is divided. By the division, a mask pattern for the exposure system is extracted. Assume that the above mask pattern is used to produce a mask for the exposure system and then effect partial simultaneous electron beam exposure. Then, connection errors occur at each time of exposure, due to the deviations of the patterns divided on the boundaries of the repeated pattern areas. Consequently, resist patterns transferred from the mask to the wafer are low in dimensional accuracy. Moreover, because the matching of the repeated patterns must be taken into consideration, the mask pattern extracting procedure is complicated.

There is an increasing demand for dimensional accuracy of less than ±0.02 $\mu$m for a designed pattern dimension of 0.2 $\mu$m in order to implement high integration and fine configuration of devices. It is therefore necessary to reduce the deterioration of dimensional accuracy ascribable to the connection errors discussed above.

Technologies relating to the present invention are also disclosed in. e.g., Japanese Patent Laid-Open Publication No. 5-136036.

SUMMARY OF THE INVENTION

It is therefore an object of the present invention to provide a mask data generating method and a mask for an electron beam exposure system and capable of reducing connection errors occurring at each time of partial simultaneous radiation, and thereby enhancing the dimensional accuracy of a pattern to be transferred from the mask to an Si wafer.

In accordance with the present invention, a method of generating mask data for an electron beam exposure system has the steps of dividing a mask pattern for an integrated circuit, which includes a plurality of repeated patterns each being made up of at least a plurality of basic patterns, into a plurality of rectangular areas each being capable of exposure by a single shot by the exposure system, extracting basic patterns included in the individual rectangular area, determining whether or not one or more of the basic patterns extracted are divided on boundaries between nearby rectangular areas, and excluding the one or more basic patterns divided on the boundaries from the individual repeated pattern. As a result, the mask data are generated.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
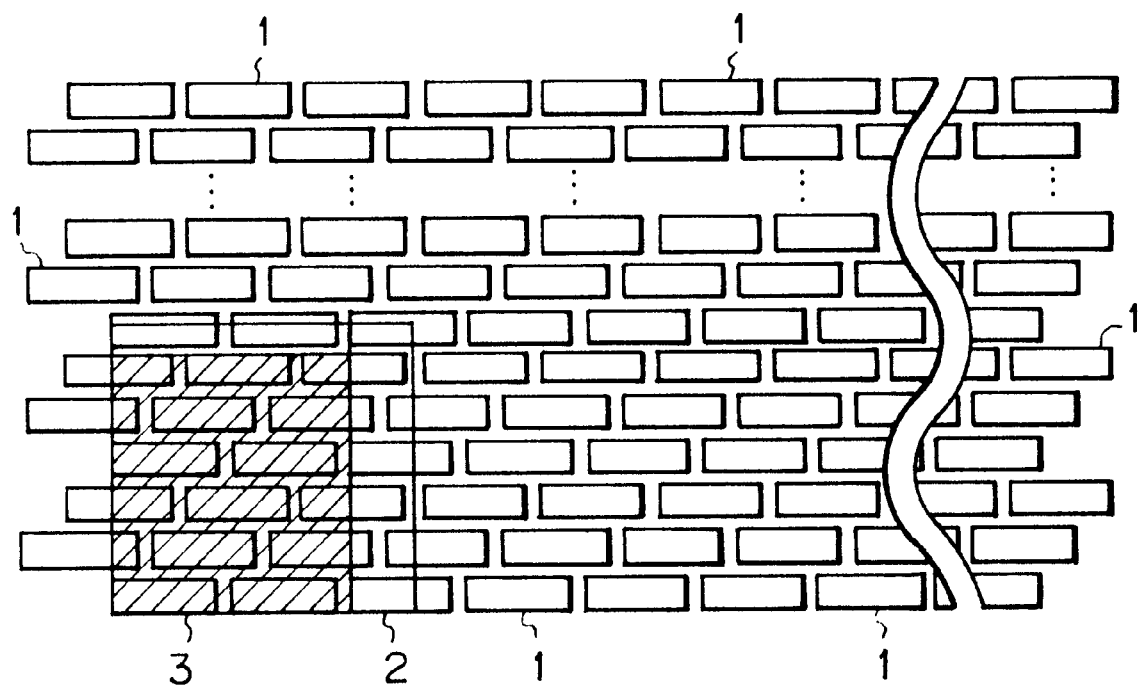
FIG. 1 shows a conventional procedure for producing a mask pattern for a partial simultaneous electron beam exposure system.
Figure 2A:
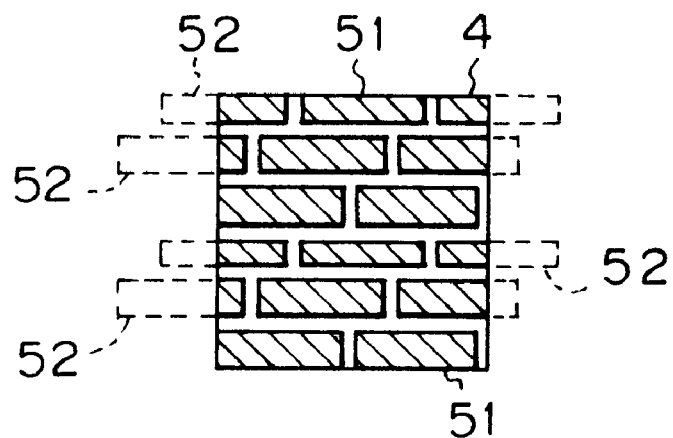
FIGS. 2A and 2B demonstrate connection errors occurring on boundaries between nearby repeated pattern areas when a mask pattern is transferred to an Si wafer by use of a repeated pattern area.
Figure 2B:
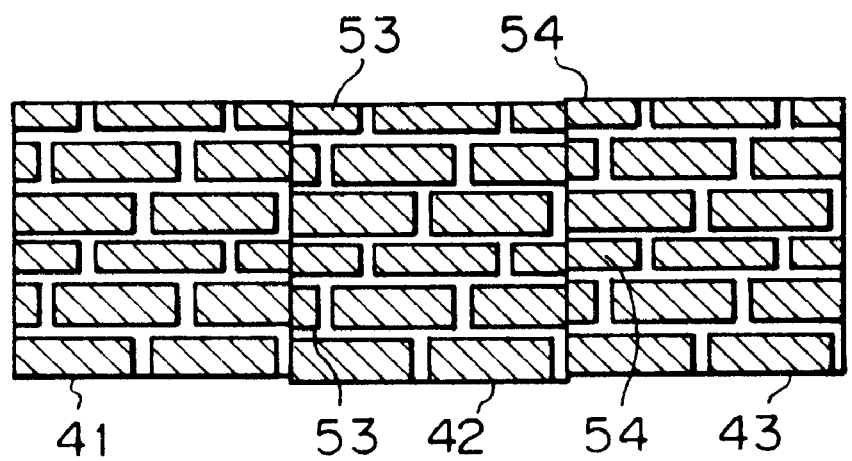

To better understand the present invention, brief reference will be made to a conventional process for dividing patterns extending over boundaries between nearby partial simultaneous electron beam shots, shown in FIGS. 1, 2A and 2B. Assume that a mask for a conventional partial simultaneous electron beam exposure system is applied to a DRAM memory cell for the separation of devices. As shown in FIG. 1, despite that patterns 1 for the separation of devices each is smaller than a maximum shot area 2 indicated by a bold line, the patterns 1 are partly divided on the boundaries between repeated pattern areas 3. FIG. 2A shows the resulting mask pattern 4 (indicated hatching) for a partial simultaneous electron beam exposure system. As shown, the mask pattern 4 is made up of patterns 51 not divided and a part of patterns 52 divided on the boundaries between nearby repeated pattern areas 3.

Assume that the above mask pattern 4 is used to produce a mask for the exposure system and then effect partial simultaneous electron beam exposure. Then, as shown in FIG. 2B, the mask pattern 4 is sequentially transferred to an Si wafer in the form of patterns 41, 42 and 43. At this instant, connection errors occur at each time of exposure, due to the deviations 52 and 53 of the patterns 52 divided on the boundaries of the patterns 41, 42 and 43. Consequently, resist patterns transferred from the mask to the wafer are low in dimensional accuracy, as stated earlier. Moreover, because the matching of the repeated patterns, like the connecting portions of the patterns 52, must be taken into consideration, the mask pattern extracting procedure is complicated, as also stated earlier.

Preferred embodiments of the present invention free from the above problems will be described hereinafter.

Figure 3:
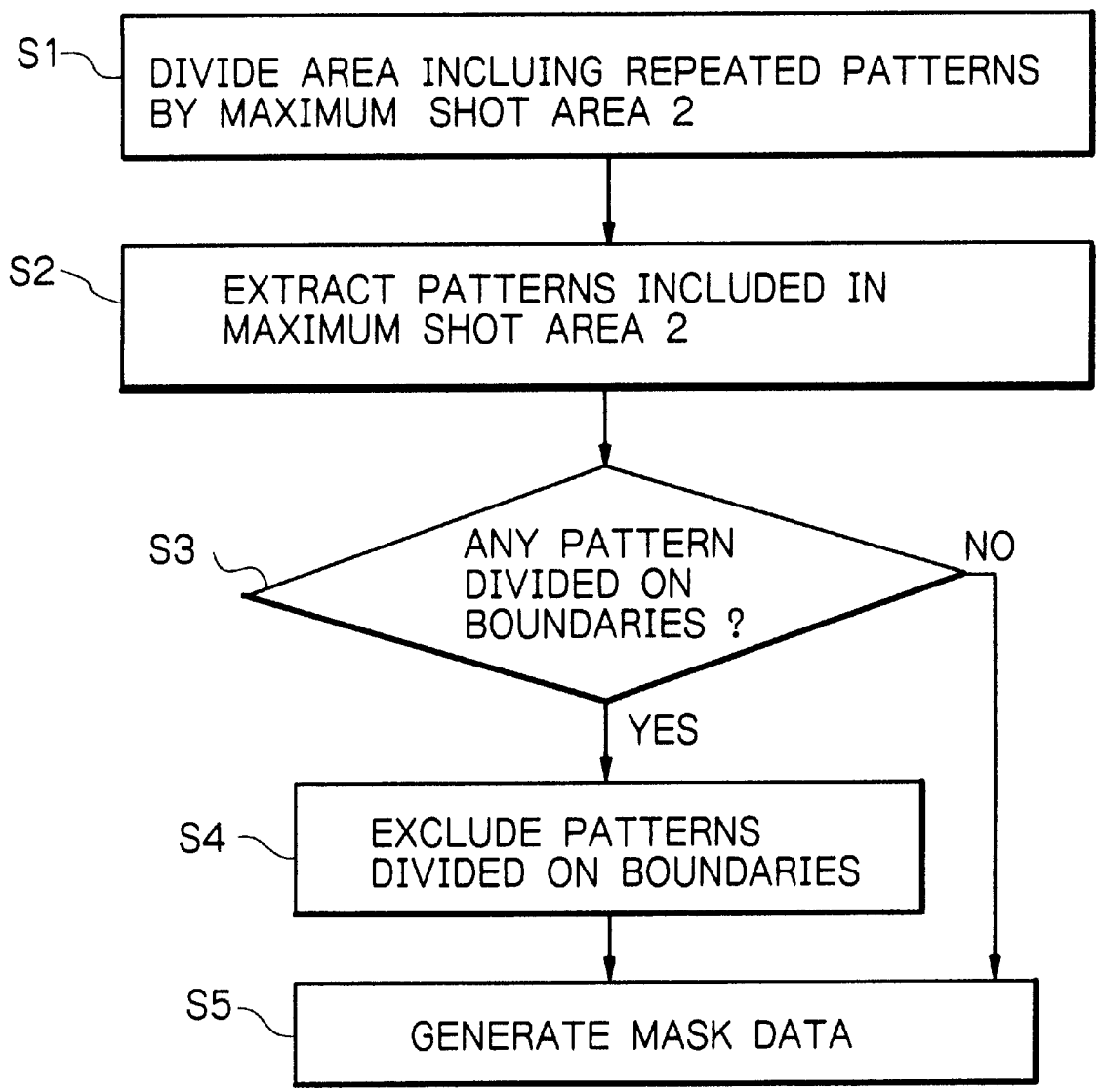
FIG. 3 is a flowchart showing a routine for generating mask data for an electron beam exposure system and representative of a first embodiment of the present invention.
Figure 4:
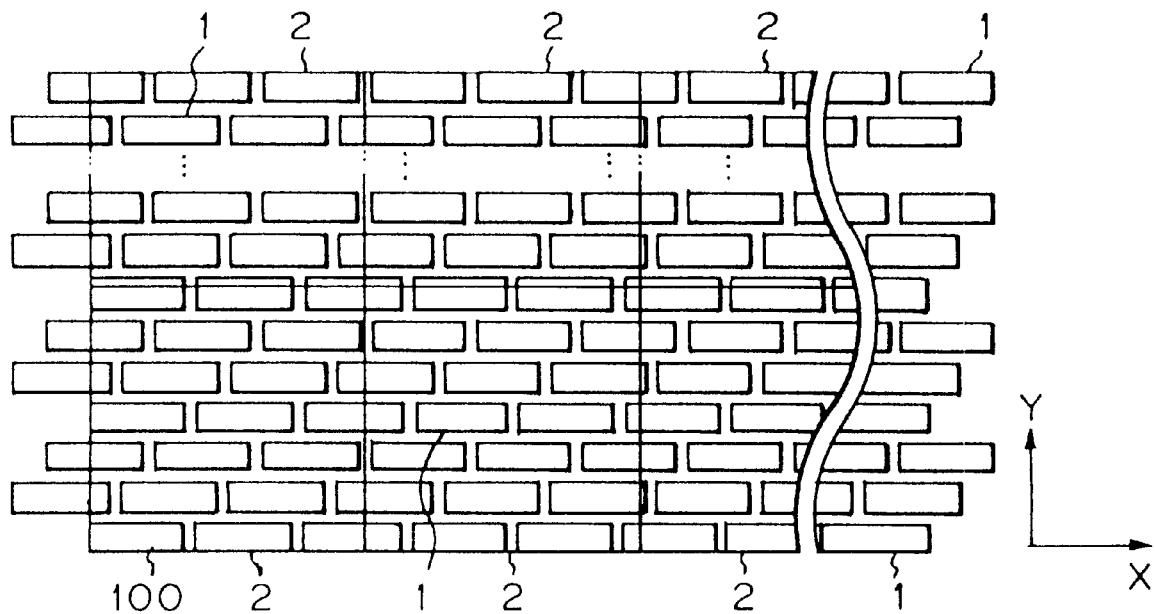
FIG. 4 shows how the above embodiment divides an area including repeated patterns into maximum radiation areas.
Figure 5:
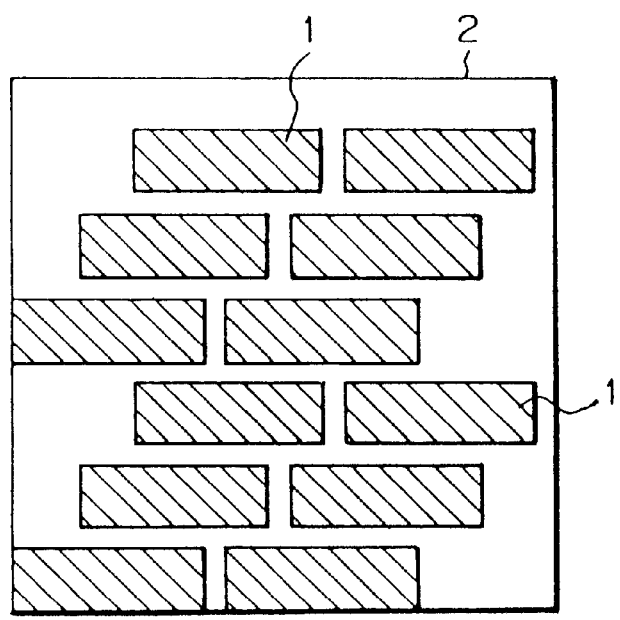
FIG. 5 shows a specific mask pattern produced by the embodiment.

FIG. 3 shows a routine for generating mask data for an electron beam exposure system and representative of a preferred embodiment of the present invention. As shown in FIG. 4, a DRAM memory cell area includes a number of patterns 1 repeated in the X (horizontal) direction and Y (vertical) direction for the separation of devices. First, the DRAM memory cell area is sequentially divided by a maximum shot area 2, taking the bottom left of a pattern 100 located at the bottom left of the memory cell area as a reference (step S1, FIG. 3). Subsequently, all the patterns 1 included in the individual maximum shot area 2 are extracted (step S2). Then, whether or not one or more of the patterns 1 are divided on the boundaries between the nearby maximum shot areas 2 is determined (step S3). If the answer of the step S3 is positive (YES), the patterns 1 divided on the boundaries are excluded from the patterns extracted in the step S2 (step S4). FIG. 5 shows the resulting mask pattern in which the patterns 1 are free from defective connection otherwise occurring at the boundaries between the maximum shot areas 2 at each time of partial simultaneous electron beam shot.

If the answer of the step S3 is negative (NO), meaning that none of the patterns 1 is divided on the above boundaries, a step S5 for producing a mask pattern is executed, skipping the step S4. The mask produced in the step S5 is also free from patterns discontinuous on the boundaries between the maximum shot areas 2, and therefore free from deterioration in dimensional accuracy.

Figure 6A:
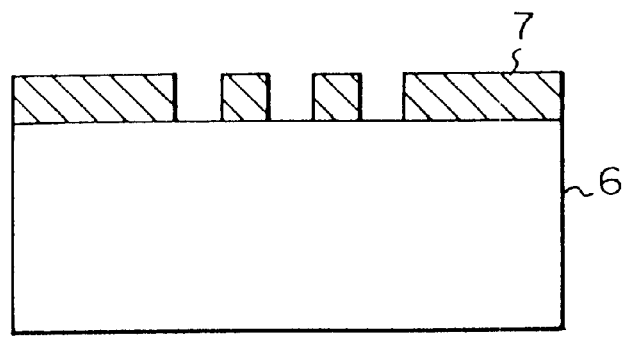
FIGS. 6A–6E are sections showing a mask producing method for an electron beam exposure system and representative of a second embodiment of the present invention.
Figure 6B:
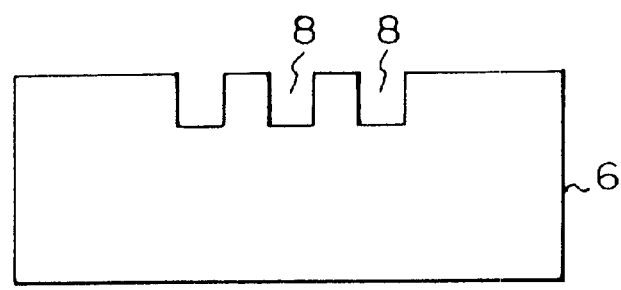
Figure 6C:
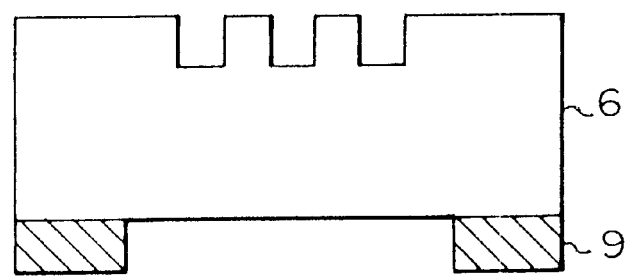
Figure 6D:
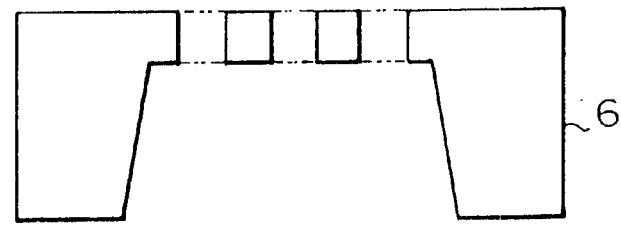

FIGS. 6A–6E show a procedure for producing a mask for an electron beam exposure system and representative of an alternative embodiment of the present invention. First, as shown in FIG. 6A, a mask material formed on an Si wafer 6 is patterned by use of the mask data generated in the first embodiment and free from the defective connection. As a result, a mask 7 for etching the Si wafer 6 is formed on the front of the wafer 6. As shown in FIG. 6B, the wafer 6 is etched over the mask 7 in order to form an aperture 8 having a desired pattern, and then the entire mask 7 is removed from the wafer 6. Subsequently, as shown in FIG. 6C, the rear of the wafer 6 is patterned and then etched in order to form a mask 9 for rear etching. As shown in FIG. 6D, the rear of the wafer 6 is etched via the mask 9 by use of a kalium hydrooxide (KOH) solution. Finally as shown in FIG, 6E, a conductive layer 10 of gold, tungsten, titanium or similar metal is grown on the front of the wafer 6.

Figure 6E:
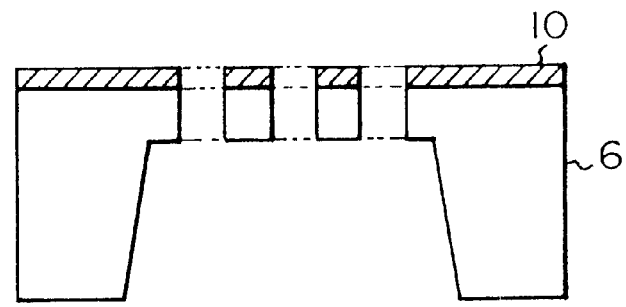

The above procedure for producing the masks may be modified as follows. In the modified procedure, the rear etching shown in FIGS. 6C and 6D is effected first. Subsequently, the front of the wafer 6 is patterned, as shown in FIG. 6A, and then etched, as shown in FIG, 6B. Finally, the conductive layer or metal film 10 is grown on the front of the wafer 6, as shown in FIG. 6E.

Figure 7:
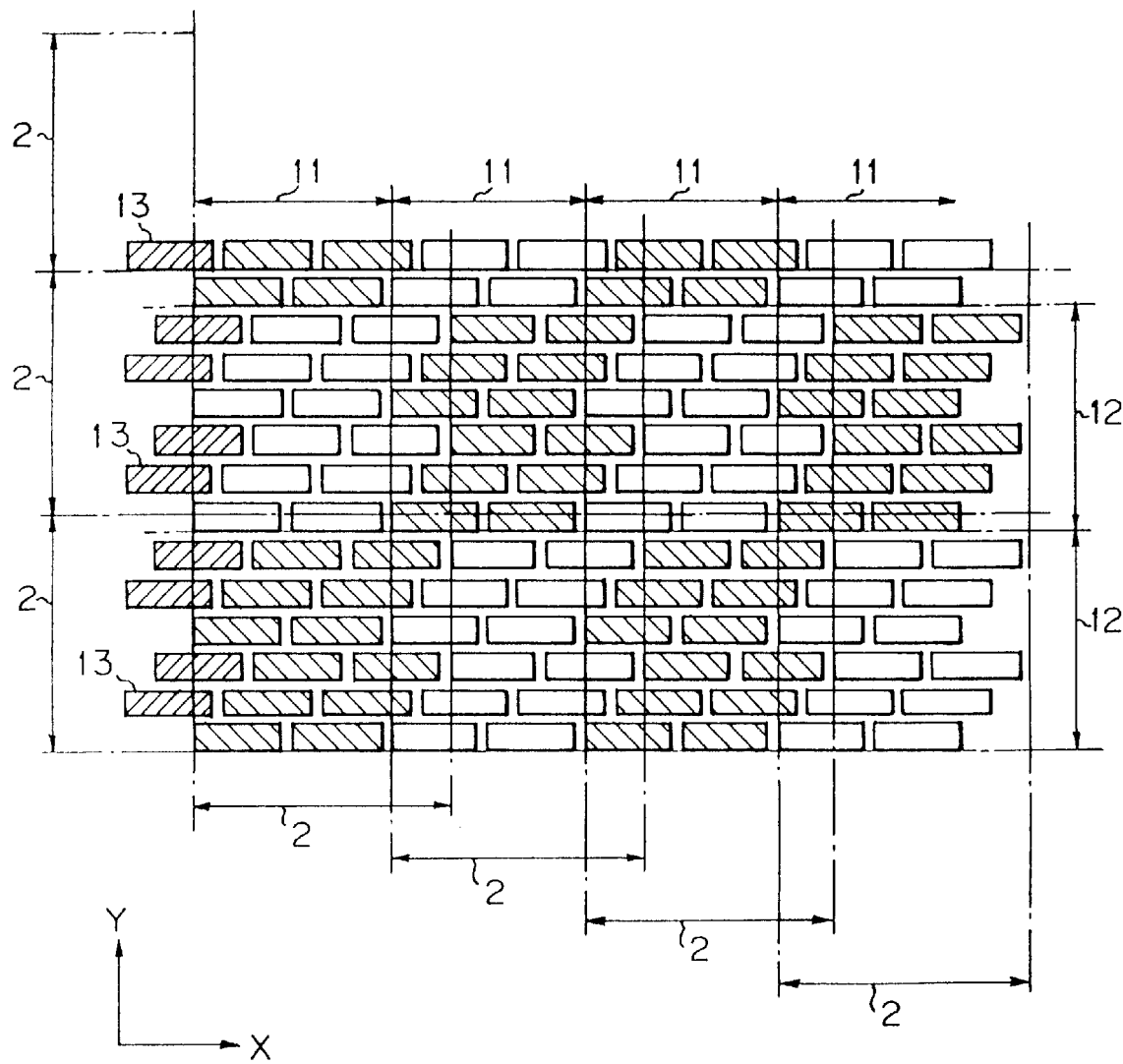
FIG. 7 shows a specific procedure in which the second embodiment transfers a mask pattern to an Si wafer by use of the mask.

FIG. 7 shows how patterns are formed on an Si wafer via the masks produced by the above second embodiment. As shown, a partial simultaneous electron beam shot is executed at a pitch 11 in the X (horizontal direction) and a pitch 12 in the Y (vertical direction). Specifically, the surface of an Si wafer is sequentially exposed such that the nearby shot areas overlap each other. In FIG. 7, the shot is repeated four times in the X direction and two times in the Y direction by way of example. Of course, the pitches 11 and 12 in the X and Y directions, respectively, should be an adequate value smaller than the maximum shot size 2. It is to be noted that patterns 13 divided on the boundaries and excluded in the step S4, FIG. 3, are exposed by a variable shaped electron beam.

In summary, in accordance with the present invention, repeated patterns are produced beforehand without dividing basic patterns included in design pattern data. The repeated pattern data are used to produce a mask for a partial simultaneous electron beam shot. This insures a resist pattern free from connection errors on the boundaries between the repeated pattern areas. The present invention therefore obviates connection errors of about 0.02 $\mu$m to 0.03 $\mu$m heretofore occurring at each time of a partial simultaneous electron beam shot, and thereby enhances the dimensional accuracy of a resist pattern produced by the shot.

Further, because the repeated patterns are free from connection errors on their boundaries, it is not necessary to take account of the matching of pattern connection at each time of a partial simultaneous electron beam shot. Therefore, mask data for the shot can be easily produced from the design pattern data.

Various modifications will become possible for those skilled in the art after receiving the teachings of the present disclosure without departing from the scope thereof.

What is claimed is:

1. A method of generating mask data for an electron beam exposure system, comprising the steps of:

(a) dividing a mask pattern for an integrated circuit, which includes a plurality of repeated patterns each being made up of at least a plurality of basic patterns, into a plurality of rectangular areas each being capable of exposure by a single shot by said electron beam exposure system;

(b) extracting basic patterns included in an individual rectangular area;

(c) determining whether or not one or more of said basic patterns extracted are divided on boundaries between nearby rectangular areas; and (d) excluding the one or more basic patterns divided on said boundaries from the individual repeated pattern, whereby the mask data are generated.

2. In a mask for an electron beam exposure system and produced by a mask data generating method for an electron beam exposure system, said mask data generating method comprises the steps of:

(a) dividing a mask pattern for an integrated circuit, which includes a plurality of repeated patterns each being made up of at least a plurality of basic patterns, into a plurality of rectangular areas each being capable of exposure by a single shot by said electron beam exposure system;

(b) extracting basic patterns included in an individual rectangular area;

(c) determining whether or not one or more of said basic patterns extracted are divided on boundaries between nearby rectangular areas; and (d) excluding the one or more basic patterns divided on said boundaries from the individual repeated pattern, whereby the mask data are generated.

3. In an exposing method for transferring a pattern represented by a mask for an electron beam exposure system to a surface of a wafer, said mask is produced by a mask data generating method for said electron beam exposure system, and said mask data generating method comprises the steps of:

(a) dividing a mask pattern for an integrated circuit, which includes a plurality of repeated patterns each being made up of at least a plurality of basic patterns, into a plurality of rectangular areas each being capable of exposure by a single shot by said electron beam exposure system;

(b) extracting basic patterns included in an individual rectangular area;

(c) determining whether or not one or more of said basic patterns extracted are divided on boundaries between nearby rectangular areas; and (d) excluding the one or more basic patterns divided on said boundaries from the individual repeated pattern, whereby the mask data are generated.

4. A method as claimed in claim 3, wherein said mask data generating method further comprises (e) exposing the one or more basic patterns divided on said boundaries by a variable shaped electron beam.

\* \* \* \* \*